United States Patent
Sotani et al.

(10) Patent No.: US 6,897,166 B2
(45) Date of Patent: May 24, 2005

(54) METHOD OF FABRICATING SEMICONDUCTOR DEVICE AND SYSTEM OF FABRICATING SEMICONDUCTOR DEVICE

(75) Inventors: Naoya Sotani, Mizuho (JP); Isao Hasegawa, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/660,609

(22) Filed: Sep. 12, 2003

(65) Prior Publication Data

US 2004/0053476 A1 Mar. 18, 2004

(30) Foreign Application Priority Data

Sep. 18, 2002 (JP) ........................................ 2002-270939

(51) Int. Cl.$^7$ .............................................. H01L 21/26
(52) U.S. Cl. ...................................................... 438/795
(58) Field of Search ................................ 438/795, 796, 438/797, 798, 799

(56) References Cited

U.S. PATENT DOCUMENTS 5,349,590 A * 9/1994 Amirkhanian et al. ......... 372/6
6,498,652 B1 * 12/2002 Varshneya et al. .......... 356/477
6,795,460 B1 * 9/2004 Itoh ............................ 372/34
6,844,523 B2 * 1/2005 Yamazaki et al. ...... 219/121.66

FOREIGN PATENT DOCUMENTS

| JP | 6-345415 | 12/1994 |
| JP | P2001-156017 A | 6/2001 |
| JP | P2001-291666 A | 10/2001 |
| JP | P2002-50576 A | 2/2002 |

\* cited by examiner

*Primary Examiner*—Michael S. Lebentritt
*Assistant Examiner*—Scott B. Geyer
(74) *Attorney, Agent, or Firm*—McDermott Will & Emery LLP

(57) ABSTRACT

A method of fabricating a semiconductor device capable of obtaining a high-density laser beam necessary for crystallizing a semiconductor layer or activating an impurity while miniaturizing a lens group provided on the outlet of an optical fiber member is provided. This method of fabricating a semiconductor device comprises steps of connecting a laser oscillator oscillating a near infrared laser beam and an irradiation optical system with each other through an optical fiber member having a single core part and heating a semiconductor layer by irradiating the near infrared laser beam from the irradiation optical system.

20 Claims, 8 Drawing Sheets

METHOD OF FABRICATING SEMICONDUCTOR DEVICE AND SYSTEM OF FABRICATING SEMICONDUCTOR DEVICE

BACKGROUND OF THE INVENTION

1. Field of the Invention

The present invention relates to a method of fabricating a semiconductor device and a system of fabricating a semiconductor device, and more particularly, it relates to a method of fabricating a semiconductor device including a step of heating a semiconductor layer with a laser beam and a system of fabricating a semiconductor device.

2. Description of the Background Art

A thin-film transistor (hereinafter referred to as a polycrystalline silicon TFT) employing a polycrystalline silicon film as an active layer has recently been employed as a pixel driving transistor for a liquid crystal display. In such a liquid crystal display, the performance of the polycrystalline silicon TFT must be improved in order to reduce the cost, improve the performance and render the display lightweight and compact. In order to improve the performance of the polycrystalline silicon TFT, a polycrystalline silicon film formed on a substrate must be converted to a single-crystalline state as much as possible.

A technique of heating a semiconductor layer with a laser beam thereby crystallizing the semiconductor layer or activating an impurity contained therein is known in general. A technique of heating a semiconductor layer by excimer laser annealing (ELA) thereby obtaining a larger crystal grain size has recently been developed. This ELA is employed for performing crystallization in a short time by pulse oscillation of several 10 nsec in order to avoid a thermal effect on a substrate as a mainstream technique of crystallization in a low-temperature process employing a low-priced glass substrate. Further, the ELA employing a laser beam having a short wavelength of about 300 nm attains high absorptivity in amorphous silicon or polycrystalline silicon. Thus, a silicon film can be heated to a high temperature in a short time.

In the aforementioned conventional excimer laser annealing (ELA), however, the absorptivity is remarkably influenced by the thickness or the quality of the heated semiconductor layer and the beam intensity is dispersed due to instability of pulse oscillation, and hence it is difficult to homogeneously heat the semiconductor layer. Therefore, device characteristics are inconveniently dispersed to reduce the yield. Further, the conventional ELA inconveniently results in a high device cost or a high operation cost. In addition, it is difficult to perform high-speed scanning with the laser beam due to the pulse oscillation. Thus, the throughput (productivity) is disadvantageously reduced.

The inventor has proposed a technique of crystallizing an amorphous silicon film with a continuous-wave YAG laser beam in Japanese Patent Laying-Open No. 2001-291666 or 2002-50576. According to this proposed method, it is possible to form gigantic crystal grains or a gigantic single crystal at a low cost and high throughput without reducing the yield.

In the aforementioned conventional method employing a YAG laser beam, however, a laser oscillator and an irradiation optical system are connected with each other through an optical system including a mirror, a lens or the like, leading to difficulty in miniaturizing the overall optical system including the irradiation optical system. Further, all of the laser oscillator, the irradiation optical system and the optical system for connecting the laser oscillator and the irradiation optical system with each other must be installed in a clean room (dust-free room), and hence the size of the clean room is inconveniently increased.

In this regard, a technique of connecting a laser oscillator and an irradiation optical system with each other through an optical fiber bundle having a plurality of core parts is proposed in general. This technique is disclosed in Japanese Patent Laying-Open No. 6-345415 (1994) or 2001-156017, for example. When the laser oscillator and the irradiation optical system are connected with each other through the optical fiber bundle, it is possible to miniaturize the overall optical system including the irradiation optical system. When the optical fiber bundle is employed, further, only the irradiation optical system may be installed in a clean room, which in turn can be prevented from size increase.

In the aforementioned method employing the optical fiber bundle formed by bundling a plurality of optical fiber members, however, it is so difficult to introduce a laser beam condensed by a lens only into the plurality of core parts of the optical fiber bundle that the laser beam is also incident upon cladding parts located around the core parts. In this case, the temperatures of the cladding parts are inconveniently increased to cause seizure if a high-density beam is incident upon the same, and hence it is difficult to remarkably increase the density of the beam incident upon the optical fiber bundle. In the conventional method employing the optical fiber bundle, therefore, it is difficult to introduce a laser beam having high optical density necessary for crystallizing a semiconductor layer or activating an impurity contained therein into the optical fiber bundle. Consequently, it is difficult to crystallize the semiconductor layer or activate the impurity in the conventional method employing the optical fiber bundle.

The aforementioned Japanese Patent Laying-Open No. 6-345415 describes a method of reducing the diameter of the optical fiber bundle on an outlet side thereby improving the optical density of the laser beam. According to this method, however, the optical density cannot be so much improved and hence it is difficult to obtain a high-density laser beam necessary for crystallizing the semiconductor layer or activating the impurity.

The density of the laser beam outgoing from the outlet of the optical fiber bundle may be remarkably increased (the laser beam may be contractedly projected) through a lens group provided on the outlet, thereby improving the optical density of the laser beam. In this case, however, the size of the lens group provided on the outlet of the optical fiber bundle is disadvantageously increased.

In the conventional method employing the optical fiber bundle, as hereinabove described, it is difficult to obtain a high-density laser beam necessary for crystallizing the semiconductor layer or activating the impurity while miniaturizing the lens group provided on the outlet of the optical fiber bundle.

SUMMARY OF THE INVENTION

The present invention has been proposed in order to solve the aforementioned problems, and an object thereof is to provide a method of fabricating a semiconductor device capable of obtaining a high-density laser beam necessary for crystallizing a semiconductor layer or activating an impurity while miniaturizing a lens group provided on an outlet of an optical fiber member.

A method of fabricating a semiconductor device according to a first aspect of the present invention comprises steps of connecting a laser oscillator oscillating a near infrared laser beam and an irradiation optical system with each other through an optical fiber member having a single core part and heating a semiconductor layer by irradiating the near infrared laser beam from the irradiation optical system. In the present invention, the term "near infrared laser beam" denotes a laser beam having a wavelength of at least 0.75 $\mu$m and not more than 2.0 $\mu$m.

In the method of fabricating a semiconductor device according to the first embodiment, as hereinabove described, the laser oscillator oscillating the near infrared laser beam and the irradiation optical system are connected with each other through the optical fiber member having the single core part, whereby a cladding part around the core part is prevented from incidence of the laser beam when the laser beam is condensed by a lens and introduced into the optical fiber member dissimilarly to a case of introducing a laser beam into an optical fiber bundle having a plurality of core parts. Thus, the cladding part can be inhibited from temperature rise, whereby the optical density of the laser beam incident upon the optical fiber member can be increased. Therefore, the optical density of the laser beam incident upon the optical fiber member having the single core part can be easily increased to a degree allowing crystallization of a semiconductor layer or activation of an impurity dissimilarly to the case of employing the optical fiber bundle, whereby the semiconductor layer can be easily crystallized or the impurity can be easily activated through the optical fiber member. Further, the optical density of the laser beam incident upon the optical fiber member can be so increased that a lens group provided on an outlet of the optical fiber member can be further miniaturized.

In addition, the laser oscillator and the irradiation optical system (heat treatment part) can be set on different locations due to the employment of the optical fiber member, whereby the degree of freedom in layout can be increased and the space of a clean room (dust-free room) for installing the irradiation optical system (heat treatment part) can be saved. Further, no optical system including a mirror, a lens or the like is required for connecting the laser oscillator and the irradiation optical system with each other due to the employment of the optical fiber member, whereby the overall optical system including the irradiation optical system can be miniaturized. Thus, the irradiation optical system can be so easily moved that the same can be scanned in addition to a substrate. Consequently, the degree of freedom of a device can be increased and the equipment can be miniaturized as compared with a case of scanning only the substrate in X-Y directions.

In the aforementioned method of fabricating a semiconductor device according to the first aspect, the step of heating the semiconductor layer preferably includes a step of crystallizing the semiconductor layer by heating the semiconductor layer with the near infrared laser beam. In the present invention, the term "crystallization" denotes a wide concept also including recrystallization of temporarily melting an already crystallized substance and thereafter re-crystallizing the same. According to this structure, the semiconductor layer can be easily crystallized with the near infrared laser beam whose optical density is improved due to incidence upon the optical fiber member having the single core part.

In the aforementioned method of fabricating a semiconductor device according to the first aspect, the step of heating the semiconductor layer preferably includes a step of activating an impurity introduced into the semiconductor layer by heating the semiconductor layer with the near infrared laser beam. According to this structure, the impurity introduced into the semiconductor layer can be easily activated with the near infrared laser beam whose optical density is improved due to incidence upon the optical fiber member having the single core part.

In the aforementioned method of fabricating a semiconductor device according to the first aspect, the step of connecting the laser oscillator and the irradiation optical system with each other through the optical fiber member preferably includes a step of connecting the laser oscillator and the irradiation optical system with each other through the optical fiber member having a length capable of reducing dispersion in intensity of the laser beam resulting from oscillation of a higher mode. According to this structure, dispersion of the intensity of the laser beam resulting from oscillation of the higher mode can be so easily reduced that the laser beam can be more homogeneously obtained. Thus, reduction of the yield resulting from dispersion in intensity of the laser beam can be suppressed.

In this case, the step of connecting the laser oscillator and the irradiation optical system with each other through the optical fiber member preferably includes a step of connecting the laser oscillator and the irradiation optical system with each other through the optical fiber member having a length of at least about 10 m. According to this structure, dispersion of the intensity of the laser beam resulting from oscillation of the higher mode can be so easily reduced that the laser beam can be easily more homogeneously obtained. Thus, reduction of the yield resulting from dispersion in intensity of the laser beam can be easily suppressed.

In the aforementioned method of fabricating a semiconductor device according to the first aspect, the laser oscillator preferably includes a first laser oscillator and a second laser oscillator, the optical fiber member preferably includes a first optical fiber member having a single core part connected to the first laser oscillator and a second optical fiber member having a single core part connected to the second laser oscillator, and the irradiation optical system preferably includes a single irradiation optical system connected with the first optical fiber member and the second optical fiber member for irradiating a single laser beam. According to this structure, the light intensity of the laser beam can be improved as compared with a case of introducing the same from a single laser oscillator. When the first and second laser oscillators are arranged along the longitudinal direction of a linear laser beam, the linear (rectangular) laser beam having a large longitudinal length can be easily formed by collecting laser beams emitted from the first and second laser oscillators.

In this case, the irradiation optical system preferably includes a first cylindrical lens receiving light from the first optical fiber member, a second cylindrical lens receiving light from the second optical fiber member, a single kaleidoscopic lens receiving the light from the first cylindrical lens and the light from the second cylindrical lens and a third cylindrical lens receiving light from the single kaleidoscopic lens while irradiating a single laser beam. According to this structure, laser beams incident upon the irradiation optical system from the two laser oscillators respectively can be easily combined into the single laser beam, whereby the light intensity of the laser beam can be easily improved as compared with a case of introducing a laser beam from a single laser oscillator.

In this case, an outlet of the first optical fiber member and an outlet of the second optical fiber member are preferably arranged along the longitudinal direction of a linear laser beam at a prescribed interval. According to this structure, the linear (rectangular) laser beam having a large longitudinal length can be easily formed by collecting laser beams emitted from the outlets of the first optical fiber member and the second laser oscillator.

In the aforementioned method of fabricating a semiconductor device according to the first aspect, the step of connecting the laser oscillator and the irradiation optical system with each other through the optical fiber member may preferably include a step of installing the laser oscillator in a first room while installing the irradiation optical system in a second room and connecting the laser oscillator and the irradiation optical system with each other through the optical fiber member having the single core part. According to this structure, the space of the second room such as a clean room for installing the irradiation optical system can be saved.

In the method of fabricating a semiconductor device according to the first aspect, the step of heating the semiconductor layer preferably includes steps of forming an absorption film either above or under the semiconductor layer and irradiating the absorption film with a continuous-wave near infrared laser beam thereby making the absorption film generate heat and crystallizing the semiconductor layer through the heat. When the semiconductor layer is indirectly heated through the heat generated from the absorption film irradiated with the laser beam, dispersion of the heat radiated from the absorption film toward the semiconductor layer is relaxed. Thus, the semiconductor layer can be substantially homogeneously heated, whereby gigantic crystal grains or a gigantic single crystal can be formed without reducing the yield. Further, the continuous-wave near infrared laser beam can be applied to high-speed scanning dissimilarly to a pulse laser beam employed in ELA, whereby a large area can be homogeneously treated in a short time. Thus, the productivity (throughput) can be improved. In addition, homogeneous heating can be performed with the continuous-wave laser beam exhibiting smaller dispersion of intensity as compared with the pulse laser beam employed in ELA.

In this case, the absorption film preferably consists of a material containing a high melting point metal. According to this structure, the absorption film can so easily absorb the laser beam that the semiconductor layer can be easily substantially homogeneously heated.

In the aforementioned method of fabricating a semiconductor device according to the first aspect, the optical fiber member may include a step index optical fiber member.

In the aforementioned method of fabricating a semiconductor device according to the first aspect, the irradiation optical system preferably includes beam homogenizer such as an array lens optical system or a kaleidoscopic optical system. According to this structure, the laser beam can be easily linearly (rectangularly) condensed.

In the aforementioned method of fabricating a semiconductor device according to the first aspect, the near infrared laser beam is preferably either a linear laser beam or a rectangular laser beam. According to this structure, the linear or rectangular laser beam having the same irradiation energy with respect to longitudinal positions can heat a larger area as compared with an ellipsoidal laser beam.

In the aforementioned method of fabricating a semiconductor device according to the first aspect, the core part of the optical fiber member preferably has a diameter of not more than about 0.6 mm. According to this structure, the focal depth of the laser beam can be easily set to a value larger than the flatness of a glass substrate.

In the aforementioned method of fabricating a semiconductor device according to the first aspect, the near infrared laser beam is preferably a continuous-wave YAG laser beam. According to this structure, a large area can be easily homogeneously treated in a short time with the continuous-wave YAG laser beam capable of high-speed scanning dissimilarly to the pulse laser beam employed for ELA. Thus, the productivity (throughput) can be easily improved. Further, the semiconductor layer can be easily homogeneously heated with the continuous-wave laser beam having smaller dispersion in intensity as compared with the pulse laser beam employed for ELA.

In the aforementioned method of fabricating a semiconductor device according to the first aspect, the step of heating the semiconductor layer by irradiating the near infrared laser beam from the irradiation optical system preferably includes a step of feedback-controlling the output of the near infrared laser beam in the laser oscillator. According to this structure, the oscillation intensity of the near infrared laser beam can be easily stabilized.

In the aforementioned method of fabricating a semiconductor device according to the first aspect, the laser oscillator may include a single laser oscillator, the optical fiber member may include a first optical fiber member and a second optical fiber member having single core parts connected to the single laser oscillator, and the irradiation optical system may include a single irradiation optical system connected with the first optical fiber member and the second optical fiber member for irradiating a single laser beam.

In this case, the laser oscillator preferably includes a first mirror transmitting about half of the oscillated laser beam while reflecting about the remaining half of the oscillated laser beam and a second mirror reflecting the laser beam reflected by the first mirror, the laser beam transmitted through the first mirror is preferably incident upon the first optical fiber member, and the laser beam reflected by the second mirror is preferably incident upon the second optical fiber member. According to this structure, laser beams of about half in intensity are simultaneously incident upon the first and second optical fiber members respectively, whereby a linear (rectangular) laser beam having a large longitudinal length can be easily obtained.

In the aforementioned method of fabricating a semiconductor device according to the first aspect, the optical fiber member preferably includes a first optical fiber member and a second optical fiber member having single core parts connected to the laser oscillator, the laser oscillator preferably includes a single laser oscillator for a dual head structure temporally switching the first optical fiber member and the second optical fiber member, the irradiation optical system preferably includes a first irradiation optical system connected with the first optical fiber member and a second irradiation optical system connected with the second optical fiber member, and the step of heating the semiconductor layer by irradiating the near infrared laser beam from the irradiation optical system preferably includes a step of irradiating different semiconductor layers with the near infrared laser beams through the first irradiation optical system and the second irradiation optical system. According to this structure, it is possible to easily heat different semiconductor layers by irradiating the same with the near infrared laser beam.

A system of fabricating a semiconductor device according to a second aspect of the present invention comprises a machinery room storing a laser oscillator oscillating a near infrared laser beam, at least either a clean room or a service area storing an irradiation optical system for heating a semiconductor layer by irradiating the near infrared laser beam from the irradiation optical system and an optical fiber member having a single core part connecting the laser oscillator and the irradiation optical system with each other.

In the system of fabricating a semiconductor device according to the second aspect, as hereinabove described, the optical fiber member is so employed that the machinery room storing the laser oscillator and either the clean room or the service area storing the irradiation optical system (heat treatment part) can be provided on different locations, whereby the degree of freedom in layout can be increased and the space of at least either the clean room (dust-free room) or the service area storing the irradiation optical system (heat treatment part) can be saved. Further, no optical system including a mirror, a lens or the like is necessary for connecting the laser oscillator and the irradiation optical system with each other due to the employment of the optical fiber member, whereby the overall optical system including the irradiation optical system can be miniaturized. Thus, the irradiation optical system can be so easily moved that the same can be scanned in addition to a substrate. Consequently, the degree of freedom of a device can be increased and the device can be miniaturized as compared with a case of scanning only the substrate in X-Y directions.

In the aforementioned system of fabricating a semiconductor device according to the second aspect, the machinery room and either the clean room or the service area may be set on different locations in a factory for fabricating the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
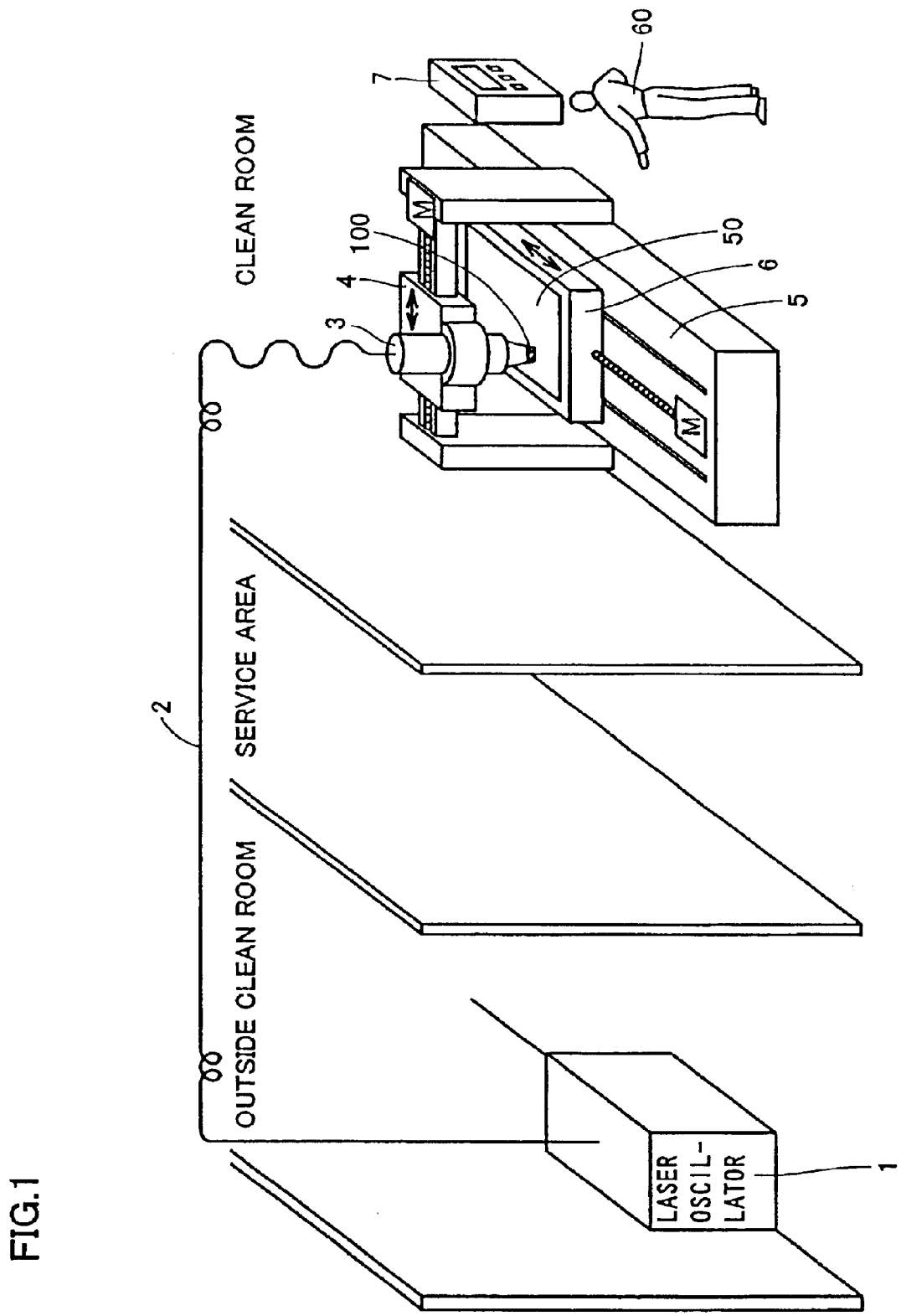
FIG. 1 is a schematic diagram showing the overall structure of a laser irradiator employed for a method of fabricating a semiconductor device and a system of fabricating a semiconductor device according to an embodiment of the present invention.

An embodiment of the present invention is now described with reference to the drawings.

First, the structure of a laser irradiator employed for a method of fabricating a semiconductor device and a system of fabricating a semiconductor device according to this embodiment is described with reference to FIGS. 1 to 3. This laser irradiator comprises a laser oscillator 1, an optical fiber member 2, an irradiation optical system 3, an irradiation optical system moving part 4, a base 5, a heater plate 6 and a control panel 7. A substrate 50 is set on the heater plate 6.

The optical fiber member 2 connects the laser oscillator 1 and the irradiation optical system 3 with each other. The laser oscillator 1 is installed in a room outside a clean room (dust-free room), while the irradiation optical system 3, the irradiation optical system moving part 4, the base 5, the heater plate 6 and the control panel 7 are installed in the clean room. A service area having intermediate cleanliness is provided between the clean room and the room, storing the laser oscillator 1, outside the clean room. This service area is a backup area for the clean room. In other words, wires, pipes etc. (not shown) for supplying electricity, gas, water etc. to the laser irradiator installed in the clean room are intensively installed in the service area.

The heater plate 6 is set on the base 5 to be movable in the short-side direction of a laser beam 100 through a motor and a screw provided on the base 5. The irradiation optical system moving part 4 including a motor and a screw is set to be movable in the long-side direction of the laser beam 100. The control panel 7 is employed for setting laser irradiation conditions for the substrate 50 and controlling initiation and termination of laser irradiation. An operator 60 carries out a laser irradiation step through the control panel 7.

Figure 2:
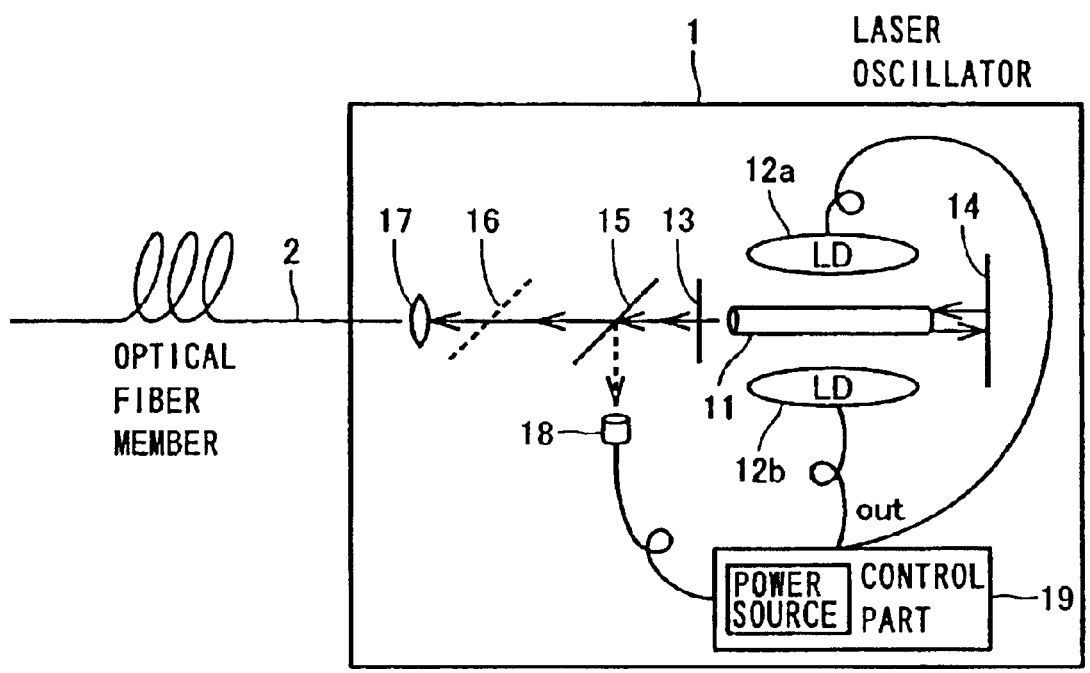
FIG. 2 is a schematic diagram showing the internal structure of a laser oscillator provided on the laser irradiator shown in FIG. 1.

Referring to FIG. 2 showing the internal structure of the laser oscillator 1 in this embodiment, semiconductor laser diodes (LDs) 12a and 12b for excitation are provided to hold a YAG lot 11 formed by a crystal for oscillating a YAG laser beam therebetween. The laser oscillator 1 is also provided with mirrors 13 and 14 for resonating the laser beam emitted from the YAG lot 11 on both longitudinal sides of the YAG lot 11. The laser oscillator 1 is further provided with a mirror 15 for partially reflecting the laser beam passing through the mirror 13 and a shutter 16 for blocking the laser beam passing through the mirror 15. A lens 17 is provided in front of the shutter 16 for condensing the laser beam and introducing the same into a single core part 2a of the optical fiber member 2. Further, a light intensity sensor 18 is provided for sensing the part of the laser beam reflected by the mirror 15.

An output of the light intensity sensor 18 is connected to a control part 19 including a power source. Outputs of the excitation semiconductor laser diodes (LDs) 12a and 12b are also connected to the control part 19. The control part 19 performs feedback control on the basis of a result of detection of the light intensity sensor 18 and the output of the excitation semiconductor laser diode (LD) 12b.

Figure 3:
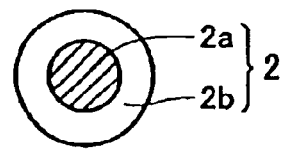
FIG. 3 illustrates the sectional structure of an optical fiber member provided on the laser irradiator shown in FIG. 1.

According to this embodiment, the optical fiber member 2 connecting the laser oscillator 1 and the irradiation optical system 3 with each other is constituted of the single core part 2a and a cladding part 2b formed on the periphery thereof, as shown in FIG. 3. The optical fiber member 2 having the core part 2a is formed as a step index type optical fiber member having the core part 2a exhibiting a uniform refractive index with a length (40 m in this embodiment) of at least about 10 m.

Figure 4:
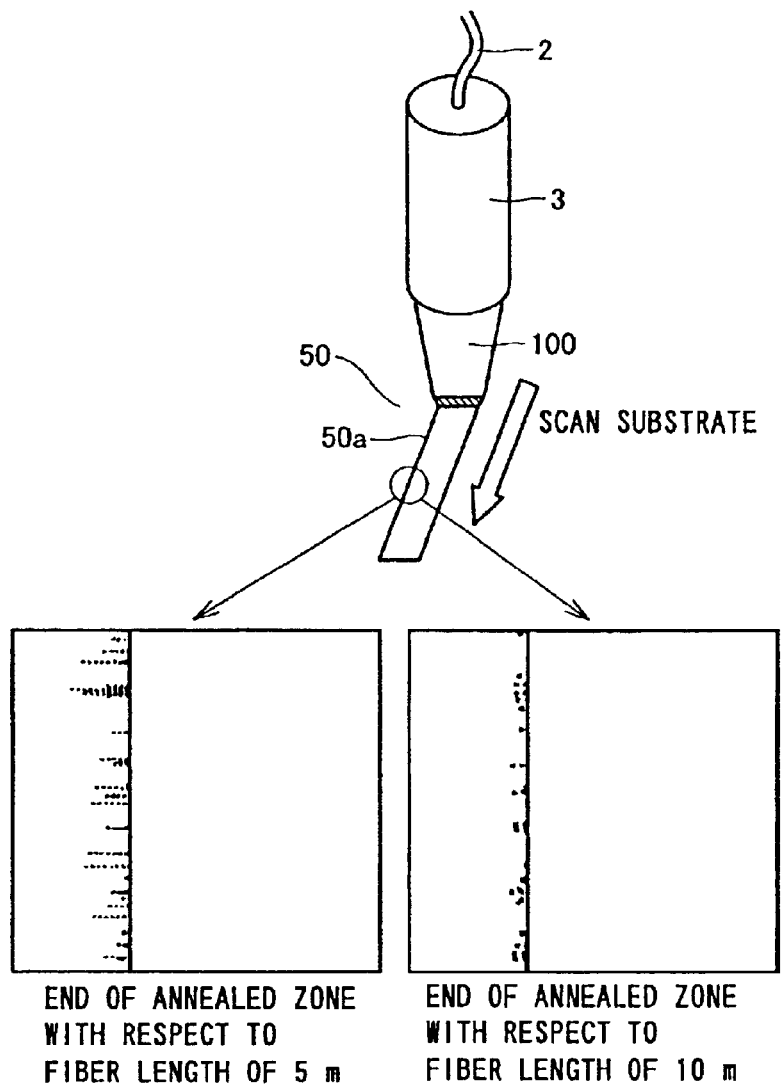
FIG. 4 is a model diagram showing crystalline states of an end of an annealed zone (scanned area) of a substrate scanned with laser beams emitted from optical fiber members having lengths of 5 m and 10 m respectively in the laser irradiator shown in FIG. 1.
Figure 5:
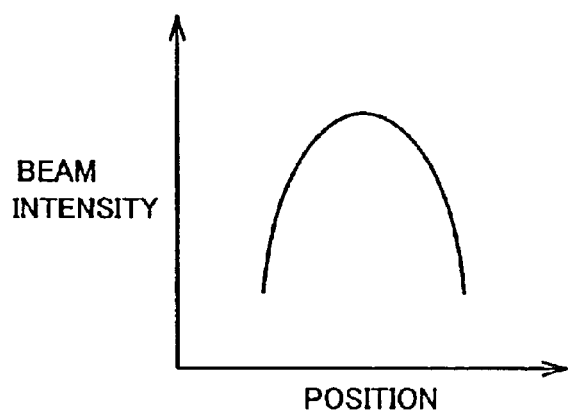
FIG. 5 is a correlation diagram showing the relation between positions and intensity distribution of a laser beam emitted from the optical fiber member of the laser irradiator shown in FIG. 1.

FIG. 4 is a model diagram showing crystalline states of an end of an annealed zone (scanned area) 50a of the substrate 50 scanned with laser beams emitted from optical fiber members having lengths of 5 m and 10 m respectively. As shown in FIG. 4, the crystalline state of the end of the annealed zone (scanned area) 50a is remarkably dispersed when the fiber length is 5 mm. Thus, it is conceivable that the intensity of the laser beam is not homogenized when the fiber length is 5 m. On the other hand, it is understood that dispersion of the crystalline state of the end of the annealed zone (scanned area) 50a is reduced when the fiber length is increased to about 10 m. Thus, it has been proved that dispersion of beam intensity resulting from oscillation of a higher mode can be reduced when the fiber length is about 10 m. Therefore, the optical fiber member 2 preferably has a length of at least about 10 m. In consideration of this point, the length of the optical fiber member 2 is set to about 40 m in this embodiment as described above. Thus, the intensity of the laser beam at an outlet of an optical fiber member 2 can be homogenized according to this embodiment as shown in FIG. 5.

Figure 6:
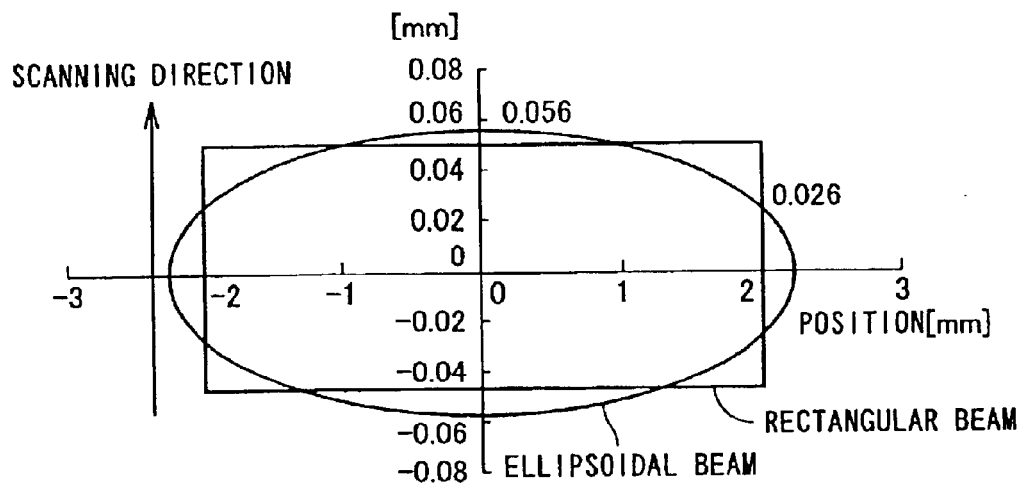
FIG. 6 is a schematic diagram showing the relation between positions and intensity levels of rectangular and ellipsoidal beams.
Figure 7:
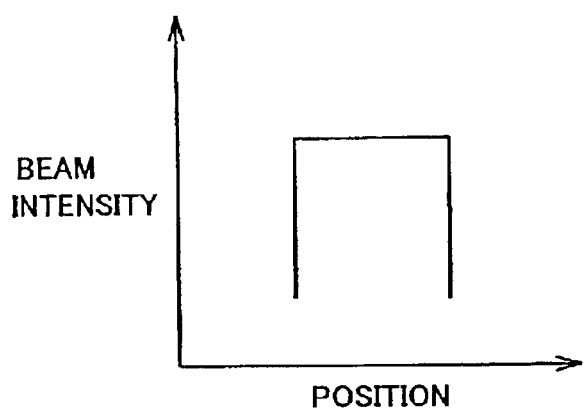
FIG. 7 is a correlation diagram showing the relation between positions and intensity distribution of the rectangular beam shown in FIG. 6.

FIG. 6 is a schematic diagram for illustrating difference between cases of forming ellipsoidal and rectangular beams respectively, and FIG. 7 is a correlation diagram showing the relation between positions and intensity levels of the rectangular beam shown in FIG. 6.

Referring to FIG. 6, an array lens optical system or a kaleidoscopic optical system for linearly (rectangularly) condensing a laser beam is employed in this embodiment as the irradiation optical system 3 connected to the forward end of the optical fiber member 2. When the ellipsoidal laser beam is formed through a mere cylindrical lens, the energy of irradiation varies with the transverse positions as shown in FIG. 6. In other words, the ellipsoidal laser beam applied to an end with smaller energy as compared with a central portion allows excellent crystallization by about 70% as compared with the rectangular beam. On the other hand, the rectangular beam transversely applied with homogeneous energy allows crystallization of a wider area as compared with the ellipsoidal beam. Therefore, a rectangular beam is employed in this embodiment. Thus, the rectangular beam shown in FIG. 7 is obtained through the irradiation optical system 3 from the state shown in FIG. 5.

According to this embodiment, the core part 2a of the optical fiber member 2 has a diameter (core diameter) of not more than about 0.6 mm for the following reason:

The flatness of a glass substrate is about 100 $\mu$m, and hence the focal depth of the laser beam 100 must be at least about ±100 $\mu$m. If the optical fiber member 2 has a core diameter of 0.3 mm for condensing a laser beam having a short side of 0.1 mm, the beam quality is 50 mm·mrad. The beam quality, expressed by the product of the width of a thin portion of the beam and the beam divergence angle, is improved as the value thereof is reduced. This beam quality cannot be improved through an optical system. The relation between the beam quality and the diameter of the optical fiber member is approximately decided such that the former is 50 mm·mrad when the latter is 0.3 mm as described above and the former is 100 mm·mrad when the latter is 0.6 mm.

Assuming that allowable accuracy for the short side of the laser beam emitted from the optical fiber member having the core diameter of 0.3 mm is 0.1 mm+0.02 mm, the beam focal depth is ±240 $\mu$m at the maximum. When the core diameter of the core part 2a of the optical fiber member 2 is 0.6 mm, the focal depth is ±120 $\mu$m at the maximum.

In order to obtain a focal depth of at least ±100 $\mu$m, therefore, the core part 2a of the optical fiber member 2 preferably has a core diameter of not more than 0.6 mm. According to this embodiment, the core diameter of the core part 2a of the optical fiber member 2 is set to 0.3 mm in consideration of this point. In this embodiment, the focal depth of the optical fiber member 2 having the core part 2a exhibiting the core diameter of 0.3 mm and the irradiation optical system 3 is ±150 $\mu$m in practice.

The method of fabricating a semiconductor device according to this embodiment is now described with reference to FIGS. 1, 2, 8 and 9.

Figure 8:
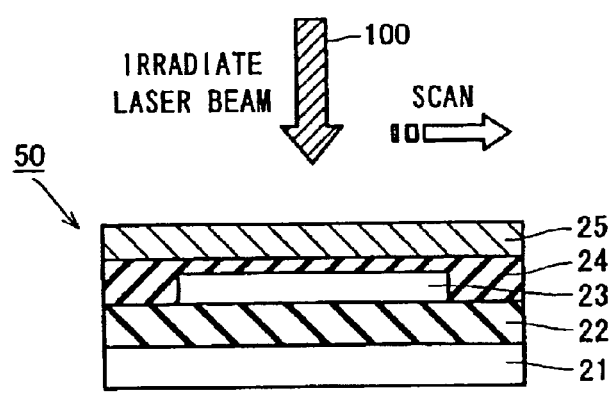
FIGS. 8 and 9 are sectional views for illustrating a process of fabricating a semiconductor device according to the embodiment of the present invention.

As shown in FIG. 8, a buffer layer 22 consisting of an $SiO_2$ film having a thickness of about 600 nm and an $SiN_x$ film having a thickness of about 20 nm in ascending order is formed on a glass substrate 21 by plasma CVD. An islanded semiconductor layer 23 of amorphous silicon or polycrystalline silicon for serving as an active layer is formed on the buffer layer 22 with a thickness of about 50 nm. An $SiO_2$ film 24 is formed by plasma CVD to cover the semiconductor layer 23 with a thickness of about 100 nm. An absorption film 25 of Mo having a thickness of about 50 nm is formed on the $SiO_2$ film 24. Preheating is performed at a temperature of about 200° C., for thereafter scanning the upper surface of the absorption film 25 with the continuous-wave YAG laser beam 100 condensed to a rectangular shape of about 0.1 mm by about 4 mm with the laser irradiator shown in FIG. 1 under conditions of a laser output of about 385 W, a scanning rate of about 1000 mm/s. and atmosphere gas of Ar.

Figure 9:
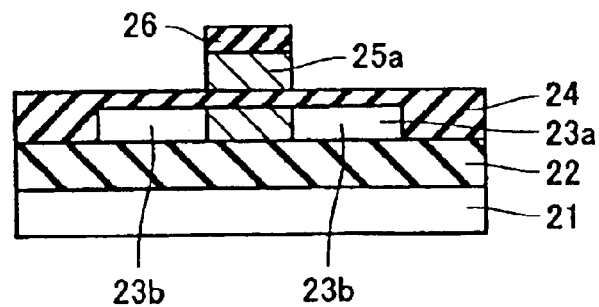

More specifically, the substrate 50 having the structure shown in FIG. 8 is fixed onto the heat plate 6 shown in FIG. 1 with a vacuum chuck (not shown). When the upper surface of the absorption film 25 is scanned with the laser beam 100, the heater plate 6 receiving the substrate 50 thereon is moved along the longitudinal direction of the substrate 50 (the short-side direction of the laser beam 100) at a rate of about 1000 mm/s. When unidirectional movement is terminated, the shutter 16 (see FIG. 2) in the laser oscillator 1 is closed to transmit no laser beam to the optical fiber member 2. Then, the heater plate 6 is oppositely moved while the irradiation optical system 3 is moved along the long-side direction of the laser beam 100 (the short-side direction of the substrate 50) by about 3.8 mm with the irradiation optical system moving part 4. The shutter 16 is reopened and the heater plate 6 is moved along the longitudinal direction of the substrate 50 again at the rate of about 1000 mm/s. for scanning the substrate 50 with the linear (rectangular) laser beam 100. Such scanning with the laser beam 100 is so repeated as to irradiate the overall substrate 50 (the absorption film 25) with the laser beam 100. The absorption film 25 scanned with the laser beam 100 generates heat, which in turn is applied to the semiconductor layer 23 for crystallizing the same. Thus, a crystallized semiconductor layer 23a is obtained as shown in FIG. 9. In this case, the semiconductor layer 23 of silicon hardly absorbs the YAG laser beam 100.

The operator 60 operates control panel 7 arranged in the clean room shown in FIG. 1, for scanning the substrate 50 with the laser beam 100. The output of laser oscillation is feedback-controlled in the laser oscillator 1 in a cycle of 0.1 ms. Thus, oscillation strength is stabilized.

After the aforementioned scanning, an $SiO_2$ film (not shown) of about 100 nm in thickness is formed on the absorption film 25 by plasma CVD. Thereafter the multilayer film of this $SiO_2$ film and the absorption film 25 is patterned in the form of a gate electrode, thereby forming a gate electrode 25a of Mo and an $SiO_2$ film 26 as shown in FIG. 9.

A resist mask (not shown) is formed on a prescribed region for implanting $P^+$ (phosphorus) ions and $B^+$ (boron) ions into an n-channel TFT forming portion and a p-channel TFT forming portion under conditions of about 80 keV and about $7 \times 10^{14}$ $cm^{-2}$ and conditions of about 35 keV and about $1.5 \times 10^{15}$ $cm^{-2}$ respectively. Thereafter the implanted impurities are activated by RTA (rapid thermal annealing). Thus, source/drain regions 23b are formed as shown in FIG. 9. An n-channel TFT and a p-channel TFT are formed in the aforementioned manner.

According to this embodiment, as hereinabove described, the laser oscillator 1 oscillating the YAG laser beam 100 and the irradiation optical system 3 are connected with each other through the optical fiber member 2 having the single core part 2a, whereby the cladding part 2b provided around the core part 2a is prevented from incidence of the laser beam 100 condensed by the lens 17 and introduced into the optical fiber member 2 dissimilarly to a case of introducing a laser beam into an optical fiber bundle having a plurality of core parts. Thus, the cladding part 2b can be inhibited from temperature rise, whereby the optical density of the laser beam incident upon the optical fiber member 2 can be increased. Thus, the optical density of the laser beam incident upon the optical fiber member 2 having the single core part 2a can be easily improved to a degree allowing crystallization of the semiconductor layer 23 dissimilarly to the case of employing the optical fiber bundle, whereby the semiconductor layer 23 can be easily crystallized through the optical fiber member 2.

According to this embodiment, further, the optical density of the laser beam incident upon the optical fiber member 2 can be improved due to the single core part 2a as hereinabove described, whereby a lens group provided on an outlet of the optical fiber member 2 can be further miniaturized.

According to this embodiment, in addition, the laser oscillator 1 and the irradiation optical system (heat treatment part) 3 can be set on different locations due to the employment of the optical fiber member 2, whereby the degree of freedom in layout can be increased and the space of the clean room (dust-free room) for installing the irradiation optical system (heat treatment part) 3 can be saved. Further, no optical system including a mirror, a lens or the like is required for connecting the laser oscillator 1 and the irradiation optical system 3 with each other due to the employment of the optical fiber member 2, whereby the overall optical system including the irradiation optical system 3 can be miniaturized. Thus, the irradiation optical system 3 can be so easily moved that the same can also be scanned in addition to the substrate 50. Consequently, the degree of freedom of the laser irradiator can be increased as compared with a case of scanning only the substrate 50 in X-Y directions, and the laser irradiator can be miniaturized.

According to this embodiment, further, the length of the optical fiber member 2 is so set to about 40 m that dispersion in intensity of the laser beam 100 resulting from oscillation of a higher mode can be reduced. Thus, the laser beam 100 can be further homogenized so that the yield can be inhibited from reduction resulting from dispersion in intensity of the laser beam 100.

According to this embodiment, the absorption film 25 is irradiated with the continuous-wave YAG laser beam 100 to generate heat for crystallizing the semiconductor layer 23, whereby dispersion of the heat applied from the absorption film 25 to the semiconductor layer 23 is relaxed. Thus, the semiconductor layer 23 can be substantially homogeneously heated, thereby forming the crystallized semiconductor layer 23a having gigantic crystal grains or a gigantic single crystal without reducing the yield. Further, high-speed scanning is enabled due to the continuous-wave YAG laser beam 100 dissimilarly to a pulse laser beam employed in ELA, whereby a large area can be homogeneously treated in a short time. Thus, the productivity (throughput) can be improved. In addition, the semiconductor layer 23 can be homogeneously heated with the continuous-wave YAG laser beam 100 having smaller dispersion in intensity than the pulse laser beam employed in ELA method.

Although the present invention has been described and illustrated in detail, it is clearly understood that the same is by way of illustration and example only and is not to be taken by way of limitation, the spirit and scope of the present invention being limited only by the terms of the appended claims.

For example, while the continuous-wave YAG laser beam 100 is employed in the aforementioned embodiment, the present invention is not restricted to this but another laser beam may alternatively be employed so far as the same is a continuous-wave near infrared laser beam having a wavelength of at least 0.75 μm and not more than 2.0 μm. For example, a continuous-wave $YVO_4$, YLF or NYAB laser beam may alternatively be employed.

While the semiconductor layer 23 is heated with the near infrared laser beam to be crystallized in the aforementioned embodiment, the present invention is not restricted to this but activation of an impurity introduced into a semiconductor layer or the like may alternatively be performed by heating the semiconductor layer with a near infrared laser beam.

While the absorption film 25 consists of Mo in the aforementioned embodiment, the present invention is not restricted to this but a film of a high melting point metal or an alloy such as a metal having a higher melting point than Si or an alloy having a liquidus line or a eutectic temperature higher than the melting point of Si, for example, or still another conductor film may alternatively be employed as the absorption film so far as the same can absorb the near infrared laser beam.

While the absorption film 25 is also employed for forming the gate electrode 25a in the aforementioned embodiment, the present invention is not restricted to this but the absorption film 25 may alternatively be also employed for forming a black matrix (screen film). Particularly when formed under the semiconductor layer 23, the absorption film 25 can be more effectively utilized as the black matrix (screen film). Further alternatively, the absorption film 25 may also be employed for forming a bias plate for a TFT.

While the length of the optical fiber member 2 having the single core part 2a is set to about 40 m in the aforementioned embodiment, the present invention is not restricted to this but the length of the optical fiber member 2 may alternatively be set to another length of at least 10 m capable of reducing dispersion in intensity of the laser beam 100 resulting from oscillation of a higher mode.

Wile the step index optical fiber member 2 whose core part 2a has a uniform refractive index is employed in the aforementioned embodiment, the present invention is not restricted to this but a grated index optical fiber member whose core part has a refractive index profile may alternatively be employed.

Figure 10:
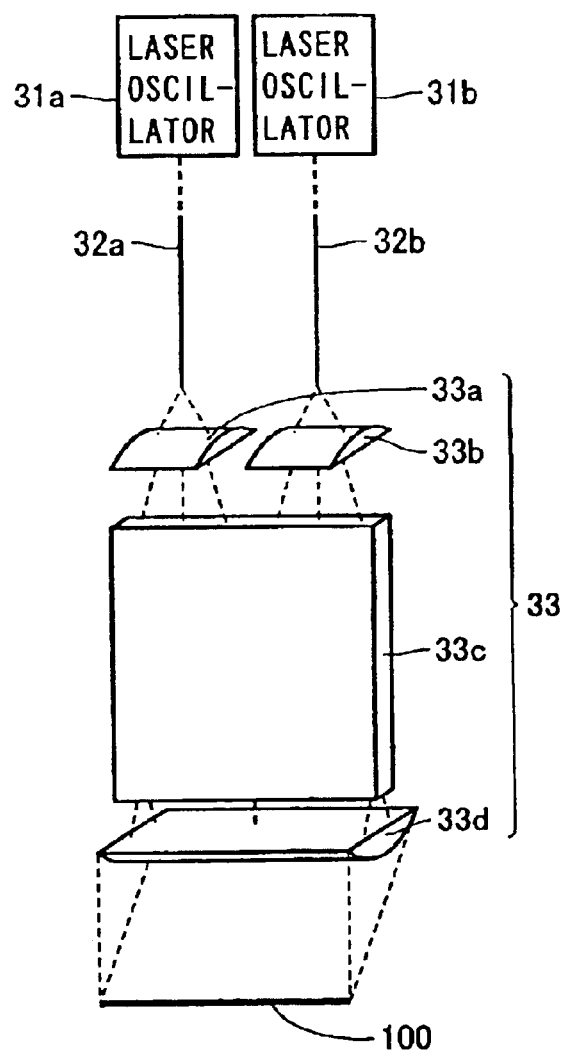
FIG. 10 is a schematic diagram showing a modification of the laser irradiator employed for the method of fabricating a semiconductor device and the system of fabricating a semiconductor device according to the embodiment shown in FIG. 1.

While the laser oscillator 1 and the irradiation optical system 3 are connected with each other through the single optical fiber member 2 having the single core part 2a in the aforementioned embodiment, the present invention is not restricted to this but laser oscillators 31a and 31b and an irradiation optical system 33 may alternatively be connected with each other through two optical fiber members 32a and 32b having single core parts as shown in FIG. 10, for example. In this case, a laser irradiator comprises the two laser oscillators 31a and 31b, the two optical fiber members 32a and 32b having single core parts and an irradiation optical system 33.

In this case, the irradiation optical system 33 includes cylindrical lenses 33a and 33b receiving light from the optical fiber members 32a and 32b respectively, a kaleidoscopic lens 33c and still another cylindrical lens 33c. According to this structure, laser beams emitted from the two laser oscillators 31a and 31b are incident upon the single irradiation optical system 33 for further increasing light intensity of a laser beam 100 as compared with a case of introducing a laser beam from a single laser oscillator. The outlets of the optical fiber members 32a and 32b are arranged along the longitudinal direction of a linear laser beam at a prescribed interval so that a linear (rectangular) laser beam having a large longitudinal length can be easily formed by condensing the laser beams emitted from the two laser oscillators 31a and 31b. Further alternatively, at least three sets of laser oscillators and optical fibers having single core parts may be connected to a single irradiation optical system.

Figure 11:
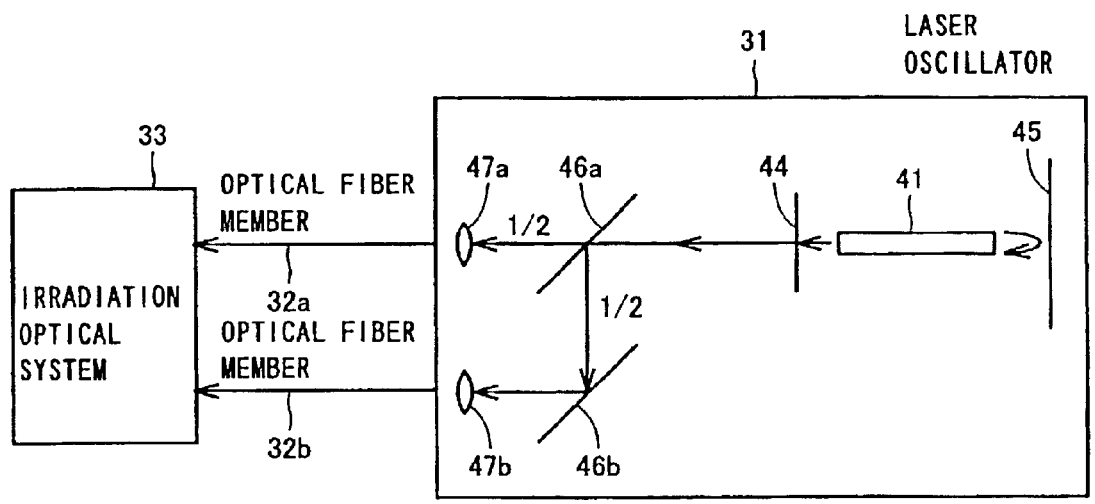
FIG. 11 is a schematic diagram showing another modification of the laser irradiator shown in FIG. 10.

The laser oscillators 31a and 31b shown in FIG. 10 may alternatively be replaced with a common laser oscillator 31 shown in FIG. 11. In this laser oscillator 31, mirrors 44 and 45 for resonance are set on both sides of a YAG lot 41. Still another mirror 46a is provided in front of the mirror 44 for transmitting half of an oscillated laser beam while reflecting the remaining half of the laser beam. The partial laser beam transmitted through the mirror 46a is condensed by a lens 47a and introduced into an optical fiber member 32a. The partial laser beam reflected by the mirror 46a is further reflected by a further mirror 46b, thereafter condensed by another lens 47b and introduced into another optical fiber member 32b. Thus, laser beams having half intensity levels are simultaneously introduced into the optical fiber members 32a and 32b respectively due to the provision of the mirror 46a. A linear (rectangular) laser beam having a large longitudinal length can be easily obtained also in this case.

In FIG. 10, one long and slender cylindrical lens may be used by connecting two cylindrical lenses 33a and 33b.

While the substrate 50 is scanned with the laser beam 100 through the single irradiation optical system 3 in the aforementioned embodiment as shown in FIG. 1, the present invention is not restricted to this but a laser irradiator of a dual head structure may alternatively be employed for irradiating two substrates with laser beams through two irradiation optical systems, for example.

Figure 12:
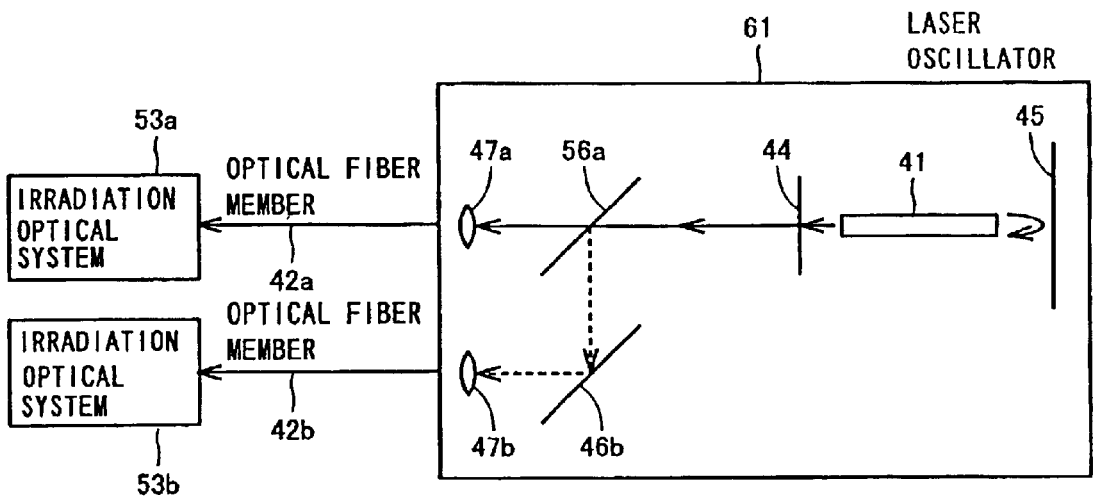
FIG. 12 is a schematic diagram showing still another modification of the laser irradiator employed for the method of fabricating a semiconductor device and the system of fabricating a semiconductor device according to the embodiment shown in FIG. 1.

More specifically, different substrates may be irradiated with laser beams through a laser oscillator 61 for a dual head structure temporally switching optical fiber members 42a and 42b and two irradiation optical systems 53a and 53b, as shown in FIG. 12. Referring to FIG. 12, mirrors 44 and 45 for resonance are set on both sides of a YAG lot 41. A switching mirror 56a switches the optical path of light passing through the mirror 44 every prescribed time. Light transmitted through the mirror 56a is condensed by a lens 47a and introduced into the optical fiber member 42a. Light reflected by the mirror 56a is reflected by another mirror 46b, thereafter condensed by another lens 47b and introduced into the optical fiber member 42b.

While the irradiation optical system 3 and the laser oscillator 1 are installed in the clean room and the room outside the clean room provided on the same floor respectively in the aforementioned embodiment as shown in FIG. 1, the present invention is not restricted to this but the irradiation optical system 3 and the laser oscillator 1 may alternatively be installed in a clean room and a machinery room (outside the clean room) provided on different floors respectively.

Figure 13:
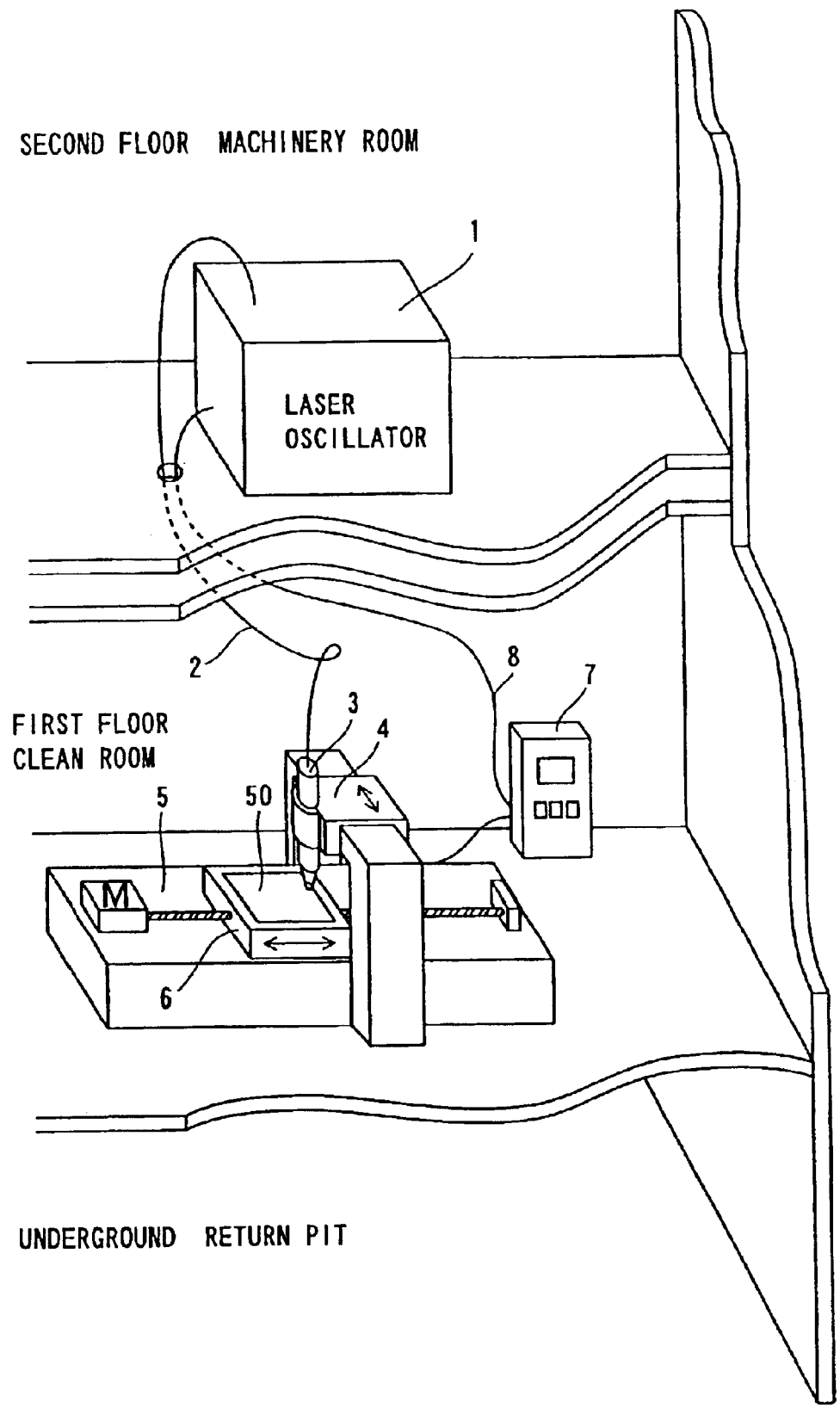
FIG. 13 is a perspective view showing the overall structure of a further modification of the laser irradiator employed for the method of fabricating a semiconductor device and the system of fabricating a semiconductor device according to the embodiment shown in FIG. 1.

More specifically, the laser oscillator 1 may be installed in a machinery room, not a clean room, provided on the second floor of a prescribed building while installing the irradiation optical system 3, the irradiation optical system moving part 4, the base 5, the heater plate 6 and the control panel 7 in a clean room provided on the first floor of the building having the machinery room storing the laser oscillator 1, as shown in FIG. 13. In this case, the optical fiber member 2 having the single core part 2a connects the laser oscillator 1 installed in the machinery room provided on the second floor and the irradiation optical system 3 installed in the clean room provided on the first floor with each other. Further, a signal line 8 connects the laser oscillator 1 installed in the machinery room provided on the second floor and the control panel 7 installed in the clean room provided on the first floor with each other. In addition, a return pit for feeding clean air into the clean room is provided under the clean room through a pipe (not shown). Also according to this structure, an effect similar to that of the aforementioned embodiment can be attained for saving the space of the clean room storing the irradiation optical system 3. In this case, no optical system including a mirror, a lens or the like is required for connecting the laser oscillator 1 and the irradiation optical system 3 with each other due to the employment of the optical fiber member 2, whereby the overall optical system including the irradiation optical system 3 can be miniaturized. Thus, the irradiation optical system 3 can be so easily moved that the same can also be scanned in addition to the substrate 50. Consequently, the degree of freedom of the laser irradiator can be increased and the laser irradiator can be miniaturized. The clean room storing the irradiation optical system 3 and the machinery room storing the laser oscillator 1 may alternatively be provided in different buildings respectively while connecting the irradiation optical system 3 and the laser oscillator 1 with each other through the optical fiber member 2 having the single core part 2a. Further, the clean room storing the irradiation optical system 3 and the machinery room storing the laser oscillator 1 may be provided in a factory fabricating semiconductor devices while connecting the irradiation optical system 3 and the laser oscillator 1 with each other through the optical fiber member 2 having the single core part 2a. In addition, a service area serving as the backup area for the clean room may further be provided in the building provided with the clean room and the machinery room.

While the irradiation optical system 3, the irradiation optical system moving part 4, the base 5, the heater plate 6 and the control panel 7 are installed in the clean room in the aforementioned embodiment as shown in FIG. 1, the present invention is not restricted to this but a closed vessel such as a chamber may be structured for moving the substrate 50 irradiated with the laser beam 100 while installing the irradiation optical system 3, the irradiation optical system moving part 4, the base 5, the heater plate 6 and the control panel 7 as well as the closed vessel such as a chamber in a service area having lower cleanliness as compared with the clean room.

Figure 14:
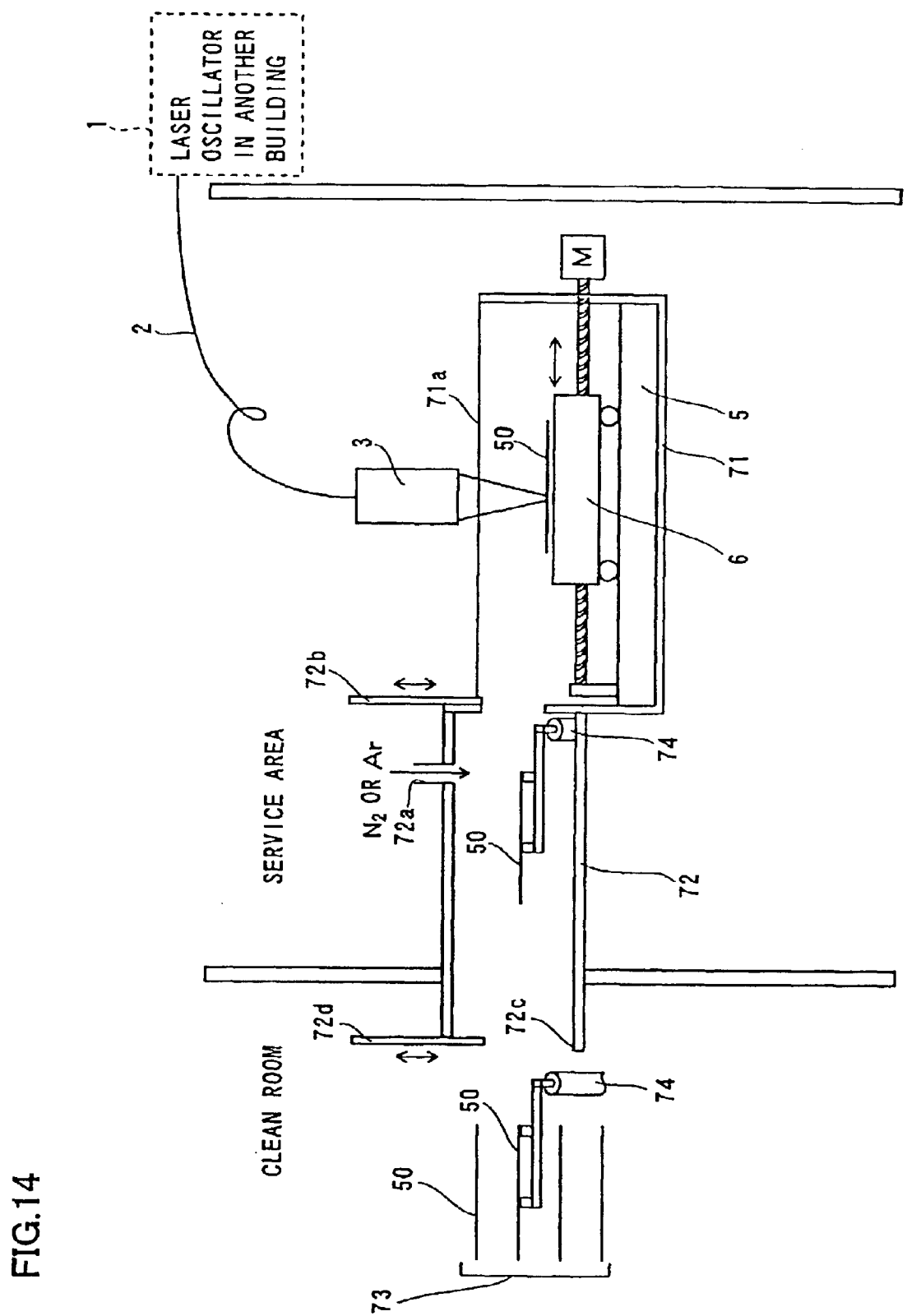
FIG. 14 is a side elevational view showing the overall structure of a further modification of the laser irradiator employed for the method of fabricating a semiconductor device and the system of fabricating a semiconductor device according to the embodiment shown in FIG. 1.

More specifically, the laser oscillator 1 may be installed in a machinery room, not a clean room, provided in a building different from that provided with the irradiation optical system 3 while installing the irradiation optical system 3, the irradiation optical system moving part 4 (not shown), the base 5, the heater plate 6 and the control panel 7 in a service area, as shown in FIG. 14. In this case, the optical fiber member 2 having the single core part 2a connects the laser oscillator 1 installed in the machinery room and the irradiation optical system 3 installed in the service area respectively with each other. An annealing chamber 71 installed in the service area stores the base 5 and the heater plate 6. A glass plate 71a capable of transmitting the laser beam 100 is provided on the upper portion of the annealing chamber 71. A substitution chamber 72 is provided in the service area. The substitution chamber 72, connected to the annealing chamber 71, is so structured that the substrate 50 is movable from the substitution chamber 72 into the annealing chamber 71.

An injection hole 72a for injecting $N_2$ or Ar is provided on the upper portion of the substitution chamber 72. A shutter 72b for isolating the substitution chamber 72 and the annealing chamber 71 from each other is provided on the boundary therebetween. An opening 72c is provided on a side of the substitution chamber 72 closer to the clean room, in order to introduce/discharge the substrate 50 into/from the substitution chamber 72. This opening 72c is provided to protrude from the service area into the clean room. Another shutter 72d is mounted on the opening 72c, in order to isolate the clean room and the substitution room 72 from each other by closing the opening 72c. A cassette 73 for setting the substrate 50 is installed in the clean room. A transport robot 74 is provided for transporting the substrate 50 set in the cassette 73 to the substitution room 72 and further transporting the same from the substitution room 72 to the annealing chamber 71.

In the laser irradiator shown in FIG. 14, the transport robot 74 transports the substrate 50 set in the cassette 73 to the substitution room 72 through the opening 72c. Then, the shutter 72d is closed to isolate the clean room and the substitution room 72 from each other. At this time, the shutter 72b provided on the boundary between the substitution room 72 and the annealing chamber 71 is opened. $N_2$ or Ar is injected from the injection hole 72a for substituting for the air in the substitution chamber 72 and the annealing chamber 71. Then, the transport robot 74 transports the substrate 50 into the annealing chamber 71 and places the same on the heater plate 6. Thereafter the substrate 50 is irradiated with the laser beam 100 through operations similar to those in the aforementioned embodiment. The laser beam 100 emitted from the irradiation optical system 3 is applied onto the substrate 50 through the glass plate 71a capable of transmitting the laser beam 100 provided on the upper portion of the annealing chamber 71.

Also according to the structure of the laser irradiator shown in FIG. 14, effects such as saving of the space of the clean room can be attained similarly to the aforementioned embodiment. According to the structure of the laser irradiator shown in FIG. 14, most part of the laser irradiator is installed in the service area while only the opening 72c of the substitution room 72 and the cassette 73 are provided in the clean room, whereby the space of the clean room can be further saved. In this case, the laser irradiator can be maintained in the service area, whereby the clean room can be inhibited from reduction of cleanliness caused by dust or the like resulting from maintenance. The service area storing the irradiation optical system 3, the irradiation optical system moving part 4, the base 5 and the heater plate 6, the machine room storing the laser oscillator 1 and the clean room may be provided in a factory fabricating semiconductor devices while connecting the irradiation optical system 3 and the laser oscillator 1 with each other through the optical fiber member 2 having the single core part 2a.

What is claimed is:

1. A method of fabricating a semiconductor device, comprising steps of:
   connecting a laser oscillator oscillating a near infrared laser beam and an irradiation optical system with each other through an optical fiber member having a single core part; and
   heating a semiconductor layer by irradiating said near infrared laser beam from said irradiation optical system.

2. The method of fabricating a semiconductor device according to claim 1, wherein
   said step of heating said semiconductor layer includes a step of crystallizing said semiconductor layer by heating said semiconductor layer with said near infrared laser beam.

3. The method of fabricating a semiconductor device according to claim 1, wherein
   said step of heating said semiconductor layer includes a step of activating an impurity introduced into said semiconductor layer by heating said semiconductor layer with said near infrared laser beam.

4. The method of fabricating a semiconductor device according to claim 1, wherein
   said step of connecting said laser oscillator and said irradiation optical system with each other through said optical fiber member includes a step of connecting said laser oscillator and said irradiation optical system with each other through said optical fiber member having a length capable of reducing dispersion in intensity of said laser beam resulting from oscillation of a higher mode.

5. The method of fabricating a semiconductor device according to claim 4, wherein
   said step of connecting said laser oscillator and said irradiation optical system with each other through said optical fiber member includes a step of connecting said laser oscillator and said irradiation optical system with each other through said optical fiber member having a length of at least about 10 m.

6. The method of fabricating a semiconductor device according to claim 1, wherein said laser oscillator includes a first laser oscillator and a second laser oscillator, said optical fiber member includes a first optical fiber member having a single core part connected to said first laser oscillator and a second optical fiber member having a single core part connected to said second laser oscillator, and said irradiation optical system includes a single irradiation optical system connected with said first optical fiber member and said second optical fiber member for irradiating a single laser beam.

7. The method of fabricating a semiconductor device according to claim 6, wherein said irradiation optical system includes a first cylindrical lens receiving light from said first optical fiber member, a second cylindrical lens receiving light from said second optical fiber member, a single kaleidoscopic lens receiving said light from said first cylindrical lens and said light from said second cylindrical lens and a third cylindrical lens receiving light from said single kaleidoscopic lens while irradiating a single laser beam.

8. The method of fabricating a semiconductor device according to claim 6, wherein an outlet of said first optical fiber member and an outlet of said second optical fiber member are arranged along the longitudinal direction of a linear laser beam at a prescribed interval.

9. The method of fabricating a semiconductor device according to claim 1, wherein said step of connecting said laser oscillator and said irradiation optical system with each other through said optical fiber member includes a step of installing said laser oscillator in a first room while installing said irradiation optical system in a second room and connecting said laser oscillator and said irradiation optical system with each other through said optical fiber member having said single core part.

10. The method of fabricating a semiconductor device according to claim 1, wherein said step of heating said semiconductor layer includes steps of:

forming an absorption film either above or under said semiconductor layer, and irradiating said absorption film with continuous-wave said near infrared laser beam thereby making said absorption film generate heat and crystallizing said semiconductor layer through said heat.

11. The method of fabricating a semiconductor device according to claim 10, wherein said absorption film consists of a material containing a high melting point metal.

12. The method of fabricating a semiconductor device according to claim 1, wherein said optical fiber member includes a step index optical fiber member.

13. The method of fabricating a semiconductor device according to claim 1, wherein said irradiation optical system includes either an array lens optical system or a kaleidoscopic optical system.

14. The method of fabricating a semiconductor device according to claim 1, wherein said near infrared laser beam is either a linear laser beam or a rectangular laser beam.

15. The method of fabricating a semiconductor device according to claim 1, wherein said core part of said optical fiber member has a diameter of not more than about 0.6 mm.

16. The method of fabricating a semiconductor device according to claim 1, wherein said near infrared laser beam is a continuous-wave YAG laser beam.

17. The method of fabricating a semiconductor device according to claim 1, wherein said step of heating said semiconductor layer by irradiating said near infrared laser beam from said irradiation optical system includes a step of feedback-controlling the output of said near infrared laser beam in said laser oscillator.

18. The method of fabricating a semiconductor device according to claim 1, wherein said laser oscillator includes a single laser oscillator, said optical fiber member includes a first optical fiber member and a second optical fiber member having single core parts connected to said single laser oscillator, and said irradiation optical system includes a single irradiation optical system connected with said first optical fiber member and said second optical fiber member for irradiating a single laser beam.

19. The method of fabricating a semiconductor device according to claim 18, wherein said laser oscillator includes a first mirror transmitting about half of said oscillated laser beam while reflecting about the remaining half of said oscillated laser beam and a second mirror reflecting said laser beam reflected by said first mirror, said laser beam transmitted through said first mirror is incident upon said first optical fiber member, and said laser beam reflected by said second mirror is incident upon said second optical fiber member.

20. The method of fabricating a semiconductor device according to claim 1, wherein said optical fiber member includes a first optical fiber member and a second optical fiber member having single core parts connected to said laser oscillator, said laser oscillator includes a single laser oscillator for a dual head structure temporally switching said first optical fiber member and said second optical fiber member, said irradiation optical system includes a first irradiation optical system connected with said first optical fiber member and a second irradiation optical system connected with said second optical fiber member, and said step of heating said semiconductor layer by irradiating said near infrared laser beam from said irradiation optical system includes a step of irradiating different semiconductor layers with said near infrared laser beams through said first irradiation optical system and said second irradiation optical system.

* * * * *